(12) United States Patent
Krivokapic

(10) Patent No.: US 6,365,466 B1
(45) Date of Patent: Apr. 2, 2002

(54) DUAL GATE PROCESS USING SELF-ASSEMBLED MOLECULAR LAYER

(75) Inventor: Zoran Krivokapic, Santa Clara, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/774,939

(22) Filed: Jan. 31, 2001

(51) Int. Cl.[7] .......................................... H01L 21/336
(52) U.S. Cl. .................................................. 438/283
(58) Field of Search ................................ 438/283, 176

(56) References Cited

U.S. PATENT DOCUMENTS

| | | | |
|---|---|---|---|
| 5,079,600 A | 1/1992 | Schnur et al. | 357/4 |
| 5,727,977 A | 3/1998 | Maracas et al. | 445/24 |
| 6,087,231 A | 7/2000 | Xiang et al. | 438/287 |
| 6,174,775 B1 * | 1/2001 | Liaw | 438/283 |
| 6,187,657 B1 * | 2/2001 | Xiang | 438/596 |
| 6,225,658 B1 * | 5/2001 | Watanabe | 257/296 |
| 6,238,982 B1 * | 5/2001 | Krivokapic et al. | 438/275 |
| 6,262,456 B1 * | 7/2001 | Yu et al. | 257/371 |
| 2001/0000629 A1 * | 5/2001 | Tsukamoto | 257/388 |

OTHER PUBLICATIONS

Joanna Aizenberg, Andrew J. Black and George M. Whitesides, Controlling local disorder in self–assembled monolayers by patterning the topography of their metallic supports, Nature, Aug. 27, 1998, pp. 868–871.
Self–Assembled Monolayers, printed from Internet address: http://www./ifm.liu.se/applphys/molfil...ject/monolayer-structure/sam/sams.html on Oct. 9, 2000, 5 pages.
Self–assembled mono–multilayers, printed from Internet address: http://www./inapg.inra.fr/ens_rech/siab/asteq/elba/salayers.htm on Nov. 14, 2000, 3 pages.
Thin Semiconductor Layers Prepared from Langmuir–Blodgett Precursor, printed from Internet address: http://www.foresight.org/Conferences/MNT6/Papers/Erokhin/ on Nov. 14, 2000, 9 pages.
Monolayer Basics, printed from Internet address: http://www./langmuir–blodgett.com/basics/faq1.htm on Nov. 14, 2000, 6 pages.
Monolayer History, printed from Internet address: http://www.langmuir–blodgett.com/basics/faq2.htm on Nov. 14, 2000, 3 pages.
Langmuir Blodgett Assembly, printed from Internet address: http://mmpwww.ph.qmw.ac.uk/bassem.html on Nov. 14, 2000, 2 pages.

* cited by examiner

Primary Examiner—David Nelms
Assistant Examiner—Thao P Le
(74) Attorney, Agent, or Firm—Foley & Lardner

(57) ABSTRACT

A method of forming dual gate structures on first and second portions, substrate includes: providing an insulative layer over the substrate; providing a first layer of material having a first work function with the first portion of the substrate; providing a second layer of material having a second work function different than the first work function over the second portion of the substrate; patterning a third layer of material over the first and second layers of material, whereby features of the third layer of material are provided over both the first and second portions of the substrate; providing a self-assembled molecular layer over at least a portion of the features, wherein the self-assembled molecular layer has regions of etch selectivity; and etching the self-assembled molecular layer at the regions of etch selectivity until gate structures are formed over the first and second portions of the substrate.

20 Claims, 4 Drawing Sheets

DUAL GATE PROCESS USING SELF-ASSEMBLED MOLECULAR LAYER

CROSS-REFERENCE TO RELATED APPLICATIONS

Not Applicable.

STATEMENT REGARDING FEDERALLY SPONSORED RESEARCH OR DEVELOPMENT

Not Applicable.

FIELD OF THE INVENTION

The present specification relates generally to fabrication processes for integrated circuits (ICs). More specifically, the present specification relates to a method of fabricating dual gate structures.

BACKGROUND OF THE INVENTION

The semiconductor industry needs to manufacture integrated circuits (ICs) with higher and higher densities of devices on a smaller chip area to achieve greater functionality and to reduce manufacturing costs. This need for large scale integration has led to a continued shrinking of the circuit dimensions and features of the devices.

The ability to reduce the size of structures such as shorter gate lengths in field-effect transistors is driven by lithographic technology which is, in turn, dependent upon the wavelength of light used to expose the photoresist. In current commercial fabrication processes, optical devices expose the photoresist using light having a wavelength of 248 nm (nanometers). Research and development laboratories are experimenting with the 193 nm wavelength to reduce the size of structures. Further, advanced lithographic technologies are being developed that utilize radiation having a wavelength of 157 nm and even shorter wavelengths, such as those used in Extreme Ultra-Violet (EUV) lithography (e.g., 13 nm).

Field effect transistors, such as MOSFETs (metal oxide semiconductor field effect transistors) are widely used in integrated circuits. One application for MOSFETS is in Complementary MOS (CMOS) circuits. CMOS circuits have the advantages of low standby power, high speed, and high noise immunity.

CMOS circuits require a balanced pair of N-and P-channel enhancement-mode devices (e.g., MOSFETS) on the same chip. This is typically achieved by fabricating one device on a substrate having one polarity type (e.g., N) and another in a well doped with an opposite impurity type (e.g., P). However, conventional techniques are unable to further reduce the gate lengths and other features sizes of the CMOS circuit. Further reduction in the gate lengths and other feature sizes is required for improved speed, density, and functionality. While wet trimming has been used to reduce feature sizes, wet trimming has less of a process window.

Accordingly, what is needed is an improved dual gate process. Further, what is needed is a dual gate process that fabricates gates having a smaller gate width than using conventional techniques. Further still, what is needed is a dual gate process that uses gate conductor materials having the same or different work functions. Further yet, what is needed is a dual gate process having a shorter gate length which is controllable by a fabrication parameter, such as, time. The teachings hereinbelow extend to those embodiments which fall within the scope of the appended claims, regardless of whether they accomplish one or more of the above-mentioned needs.

SUMMARY OF THE INVENTION

According to an exemplary embodiment, a method of forming dual gate structures on first and second portions of a substrate includes: providing an insulative layer over the substrate; providing a first layer of material having a first work function parameter over the first portion of the substrate; providing a second layer of material having a second work function parameter different than the first work function parameter over the second portion of the substrate; providing a third layer of material over the first and second layers of material; providing a self-assembled molecular layer over at least a portion of the third layer of material, wherein the self-assembled molecular layer has regions of etch selectivity; and etching the self-assembled molecular layer at the regions of etch selectivity until gate structures are formed over the first and second portions of the substrate.

According to another exemplary embodiment, an integrated circuit having dual gate structures on first and second portions of a semiconductor substrate is fabricated by the steps of: providing an insulative layer over the substrate; providing a first layer of gate conductor material having a first work function parameter over the first portion of the substrate; providing a second layer of gate conductor material having a second work function parameter different than the first work function parameter over the second portion of the substrate; providing a third layer of gate conductor material over the first and second layers of material, whereby features of the third layer of gate conductor material are provided in both the first and second portions of the substrate; providing a self-assembled molecular layer over at least a portion of the features, wherein the self-assembled molecular layer has regions of etch selectivity; and etching the self-assembled molecular layer at the regions of etch selectivity until gate structures are formed in the first and second portions of the substrate.

According to yet another exemplary embodiment, a method of fabricating dual gate structures for N- and P-channel devices on a semiconductor substrate includes: doping a first portion of the substrate with a dopant suitable for an N-channel device; doping a second portion of the substrate with a dopant suitable for a P-channel device; providing a first layer of gate conductor material over the first portion of the substrate; providing a second layer of gate conductor material over the second portion of the substrate; providing a self-assembled molecular layer over the first and second layers, wherein the self-assembled molecular layer has regions of etch selectivity; and etching the self-assembled molecular layer at the regions of etch selectivity until gate structures are formed over the first and second portions of the substrate.

BRIEF DESCRIPTION OF THE DRAWINGS

The invention will become more fully understood from the following detailed description, taken in conjunction with the accompanying drawings, wherein like reference numerals refer to like parts, in which.

DETAILED DESCRIPTION OF EXEMPLARY EMBODIMENTS

Figure 1:
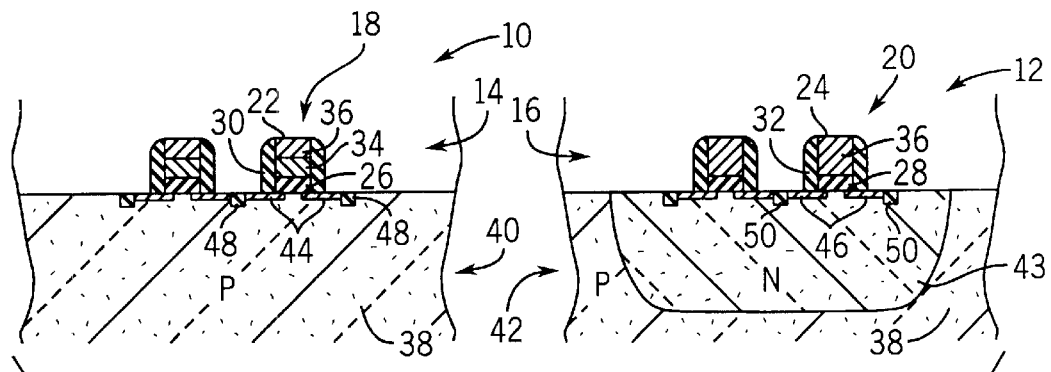
FIG. 1 is a schematic cross-sectional diagram of a dual gate structure on first and second portions of an integrated circuit, according to an exemplary embodiment.

Referring first to FIG. 1, a first portion 10 and a second portion 12 of an integrated circuit are shown according to an exemplary embodiment. First and second portions 10, 12 may be portions of a memory device, such as, a CMOS memory device, or may be other portions of an integrated circuit. First portion 10 includes a plurality of devices 14, such as, transistors (e.g., MOSFETs). Second portion 12 also includes a plurality of devices 16, which may also be transistors, such as, MOSFETs.

Devices 14, 16, include gate stacks 18, 20, respectively. Each of gate stacks 18, 20 includes a gate conductor 22, 24, a gate oxide 26, 28, and sidewall spacers 30, 32. Gate conductors 22, 24 may include materials such as polysilicon or doped polysilicon, aluminum, titanium, amorphous silicon, titanium nitride, tantalum, tungsten, nickel, copper, silver or other materials. In this exemplary embodiment, gate conductor 22 includes a first gate conductor material 34 and a second gate conductor material 36, second gate conductor material 36 being disposed over first gate conductor material 34. Gate conductor 24 includes gate conductor material 36.

Gate conductors 22 and 24 have a gate length or critical dimension (CD) of approximately 20–50 nm in this exemplary embodiment. Preferably, these very narrow gate structures are less than 100 nm long and may be fabricated at a gate length of 25 nm or less. This provides a substantial improvement over conventional processes.

First and second gate conductor materials 34, 36, may have the same work function or a different work function, in alternative embodiments. The work functions of devices can be adjusted based upon the intended function of the device in the integrated circuit. For example, transistors with low threshold voltages can be used in logic paths which have high-speed requirements. In contrast, transistors with higher threshold voltages can be used in non-critical signal paths (e.g., storage devices), thereby reducing the off-state leakage current and hence reducing the standby power consumption of the entire IC. According to one exemplary embodiment, first gate conductor material 34 has parameters for a work function of $\phi_{midgap}-(150$ to $200$ meV) and second gate conductor material 36 has parameters for a work function of $\phi_{midgap}+(150$ to $200$ meV). Parameters for the work function can include material composition, doping concentrations, etc. This exemplary work function range for first and second gate conductor materials 34 and 36 provides optimal short channel control. Alternatively, both gate conductor materials 34 and 36 may have the same work function of $\phi_{midgap}$, for example, between 4.6 and 4.7 eV.

Gate oxides 26, 28 comprise any type of gate oxide suitable for a transistor, such as, $SiO_2$, silicon nitride, $ZrO_2$, $HfO_2$ or other insulative material. Sidewall spacers 30 include a barrier layer of material, such as, a nitride, or other insulative material.

Gate stacks 18, 20 are disposed on a substrate 38, having a semiconductor material in this exemplary embodiment, such as, silicon, gallium arsenide, germanium, etc. Gate stack 18 is disposed on a first portion 40 of substrate 38 which is doped with a P-type dopant (a P well). Gate stack 20 is disposed over a second portion 42 of substrate 38 over an N-type well 43 within substrate 38. Devices 14 and 16 further include source and drain regions 44, 46, and isolation structures 48, 50 fabricated according to conventional techniques. Contacts and interconnects may further be provided to couple devices 14 and 16 to other devices on the integrated circuit.

Referring now to FIGS. 2–7, a dual gate fabrication process will now be described according to an exemplary embodiment. Each figure illustrates one or more method steps provided at each of first portion 10 and second portion 12 of the integrated circuit, in order to illustrate the dual gate fabrication process. A dual gate fabrication process refers to fabricating a first gate on a first portion of an IC and a second gate on a second portion of an IC, wherein the gates may have different or identical properties with one another and wherein the portions may be neighboring one another or at distant portions of the IC. For example, this exemplary method may be employed to fabricate a complementary MOS (CMOS) circuit having one P-channel transistor and one N-channel transistor per CMOS circuit. In this exemplary embodiment, substrate 38 is doped with a P-type dopant and portion 42 is doped with an N-type dopant to form an N-type well 43.

Figure 2:
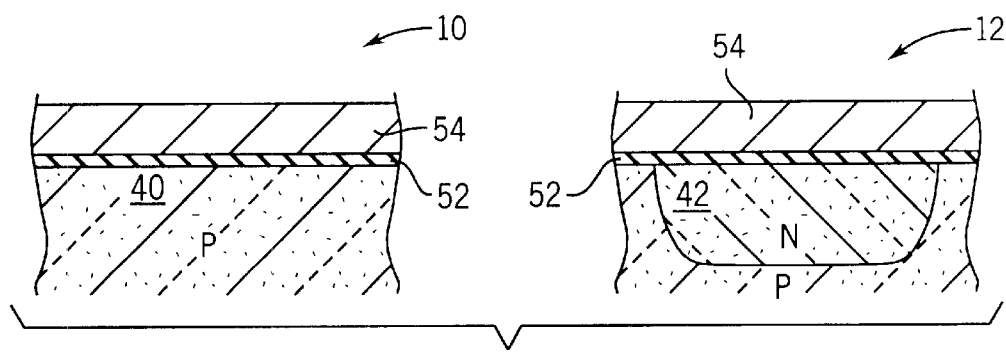
FIG. 2 is a schematic cross-sectional diagram of the first and second portions of FIG. 1, illustrating a first gate conductor material deposition step.

Referring now to FIG. 2, an insulative layer 52, such as, a gate dielectric is deposited over each of substrate portions 40 and 42. The gate dielectric may be provided with a thickness of between 1.2 and 1.6 nm, and may be provided by any conventional deposition technique, such as, chemical vapor deposition (CVD), plasma-enhanced chemical vapor deposition (PECVD), physical vapor deposition (PVD), sputtering, thermal oxidation, etc. A first gate conductor material 54 is provided over insulative layer 52, preferably with a thickness of between 30 and 50 nm, and may be provided by any conventional deposition techniques. First gate conductor material 54 may be a conductive or semi-conductive material. In this exemplary embodiment, first gate conductor material 54 has parameters for a work function of $\phi_{midgap}-(150$ to $200$ meV) in order to provide optimal short channel control. Alternatively, first gate conductor material 54 may have a work function of $\phi_{midgap}$, wherein $\phi_{midgap}$ is based upon the optimal properties of first gate conductor material 54 and a second gate conductor material to be deposited in a step as described hereinbelow.

Figure 3:
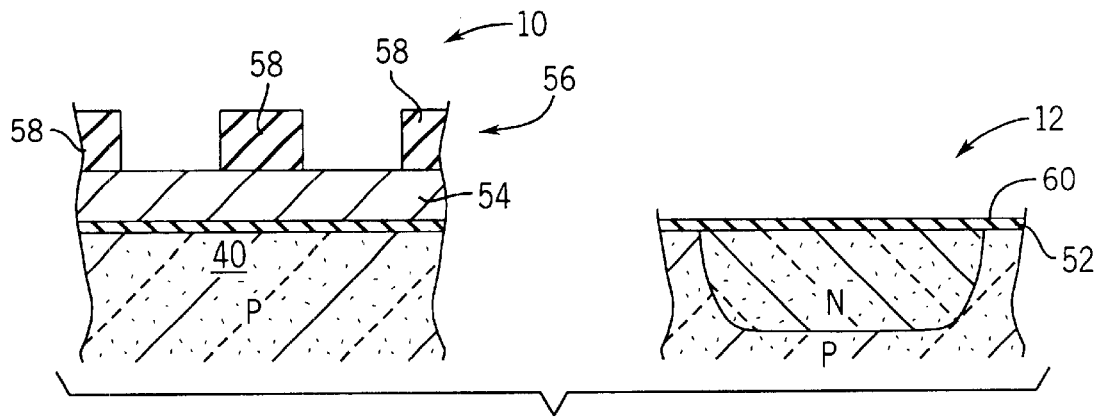
FIG. 3 is a schematic cross-sectional diagram of the first and second portions of FIG. 1, illustrating a first gate conductor material removal step and a photoresist application step.

Referring now to FIG. 3, a layer of photoresist 56 is provided over first gate conductor material 54 with a thickness of between 600 and 800 nm. Photoresist 56 is exposed to a source of radiation, such as, an excimer laser having a wavelength of 248 nm, 193 nm, 157 nm or less (e.g., EUV wavelengths). Photoresist 56 is exposed through a mask and subsequently developed to form photoresist features 58, each having a line width of between 150 and 250 nm. The portion of first gate conductor material 54 over substrate portion 42 is removed, for example, by a wet etching process ($HNO_3$ or $H_2SO_4$, depending on the material used), to expose a top surface 60 of gate insulative layer 52.

Figure 4:
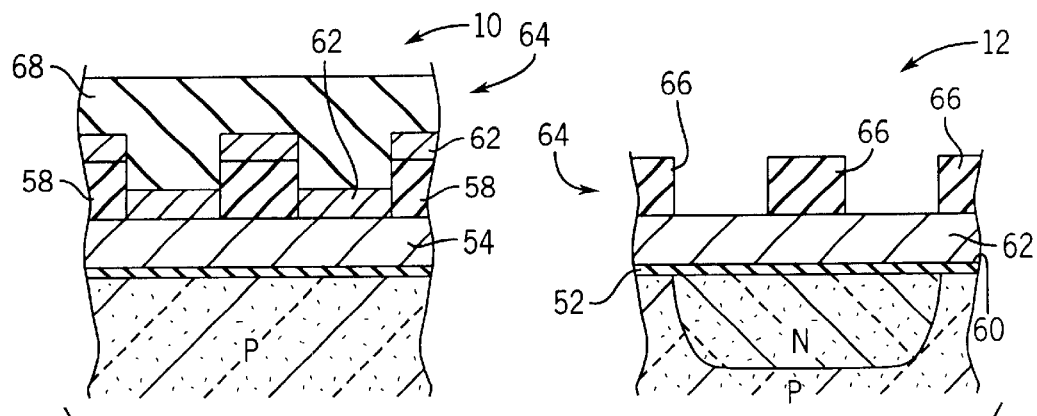
FIG. 4 is a schematic cross-sectional diagram of the first and second portions of FIG. 1, illustrating a second gate conductor material deposition step and a photoresist application step.

Referring now to FIG. 4, a second gate conductor material 62 is deposited over first gate conductor material 54 and photoresist features 58 at portion 10 and over top surface 60 of gate insulative layer 52 at portion 12. Second gate conductor material 62 is applied preferably with a thickness of between 30 and 50 nm, and is provided preferably by evaporation or another deposition process. The work function of second gate conductor material 62 is preferably $\phi_{midgap}+$(150 to 200 meV) in order to provide optimal short channel control for a P-channel device. Alternatively, second gate conductor material 62 may have a work function of $\phi_{midgap}$.

A photoresist layer 64 is applied over second gate conductor material 62. Photoresist layer 64 is applied with a thickness of between 600 and 800 nm, and is exposed through a second mask to radiation and subsequently developed to fabricate photoresist features 66 at portion 12. At portion 10, a portion 68 of photoresist 64 is applied, but is not patterned in this exemplary embodiment. Alternatively, portion 68 of photoresist 64 at portion 10 may be entirely removed with developer when developing photoresist layer 64 to fabricate photoresist features 66. Photoresist features 66 have a feature length of between 150 and 250 nm.

Figure 5:
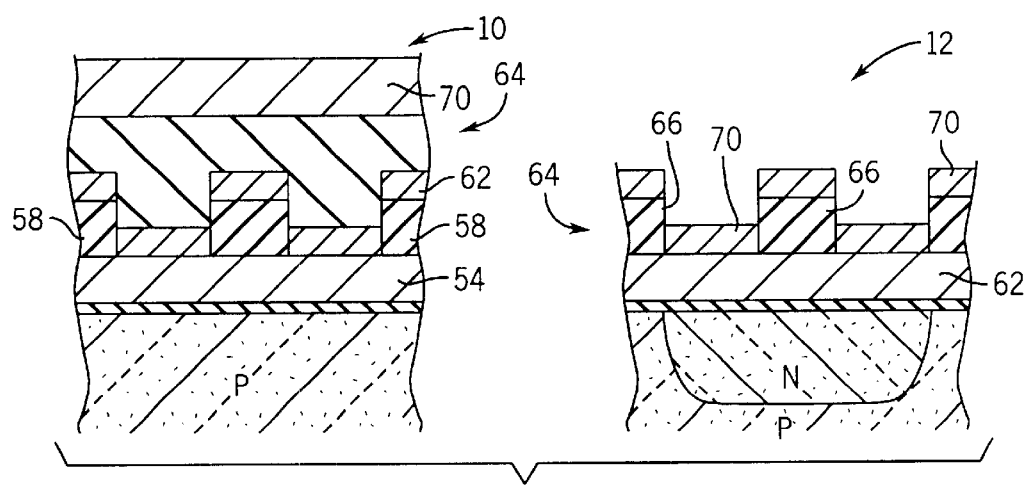
FIG. 5 is a schematic cross-sectional diagram of the first and second portions of FIG. 1, illustrating a third material deposition step.

Referring now to FIG. 5, a third layer of material 70 is applied over resist layer 64 at portion 10 and over second gate conductor material 62 and photoresist features 66 at portion 12. Third layer of material 70 may be a gate conductor material, or may be a metal layer, or other material suitable for adsorbing a self-assembled molecular layer thereon. Third layer of material 70 is provided with a thickness of between 30 and 50 nm in this exemplary embodiment. Third layer of material 70 may be the same as second gate conductor material 62 or the same as first gate conductor material 54, or may be a different material than both materials 62 and 54. In an embodiment wherein third layer of material 70 is the same as second gate conductor material 62, the gate structures fabricated therefrom will have a uniform material throughout the gate structures thereby avoiding cross-contamination.

Figure 6:
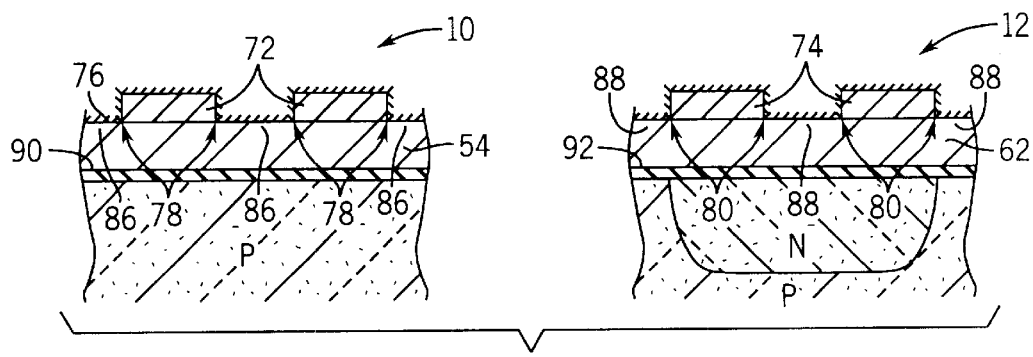
FIG. 6 is a schematic cross-sectional diagram of the first and second portions of FIG. 1, illustrating a self-assembled molecular layer provision step.

Referring now to FIG. 6, the portion of the third layer of material 70 at first IC portion 10 is removed, along with photoresist 64, resist features 66 and 58, and the portions of layers 70 and 62 above resist features 66 and 58. These layers and portions of materials may be removed by any of a variety of techniques, including a lift-off technique, chemical mechanical planarization, etching, stripping, or other removal techniques. Preferably, lift-off techniques are used. After the removal steps, portion 10 of the integrated circuit includes gate conductor features 72 over layer 54. Portion 12 includes gate conductor features 74 over layer of material 62.

In this exemplary embodiment, features 72 and 74 and layers 54 and 62 comprise materials suitable for adsorbing a self-assembled molecular layer (e.g., monolayer, multilayer, etc.). A self-assembled molecular layer is a layer of molecules which forms in a condition that will minimize its free energy. Typically, self-assembled molecules are very large molecules and their properties can be modified by chemical treatment during self-assembly. In this exemplary embodiment, each molecule has an alkane chain, typically with 10 to 20 methylene units. Each molecule has a head group with a strong preferential adsorption to the substrate used, in this case, materials 54, 62, 72, and 74. One suitable head group is a thiol (S-H) group which adsorbs well to a material including gold or silver. Accordingly, gate conductor features 72 and 74 and layers 54 and 62 may include a quantity of gold or silver therein. The thiol molecules adsorb readily from a solution onto the substrate, creating a dense monolayer or multilayer with the tail group pointing outwards from the surface, typically at an angle. By using self-assembled molecules with different tail groups, the resulting chemical surface functionality can be varied. Further, other head groups beside thiol may be implemented to adsorb to various other substrate materials, as is known.

Self-assembled molecular layer 76 may be formed under controlled conditions which determine the thickness of the self-assembled molecular layer. For example, self-assembled molecular layer 76 may be formed in a solution applied for between 10 and 15 seconds in this exemplary embodiment. As is known, self-assembled molecular layer 76 will have portions having an etch selectivity 78, 80. Self-assembled molecular layer 76 of alkanethiol serves as a resist for a subsequent wet etch. In this exemplary embodiment, etch selective portions 78 are disordered portions of self-assembled molecular layer 76 which occur at a topographical transition region, which is any region (typically between two planar surfaces) suitable for creating disorder in a self-assembled molecular layer, such as, a sharp edge, an etched edge, or other suitable topographical feature. Thus, in this exemplary embodiment, etch selective portions 78, 80 are provided at the corners between material 54 and features 72 in portion 10, and at the corners between material 62 and features 74 in portion 12. These portions 78 and 80 allow the material to which self-assembled molecular layers 76 is adsorbed to have etch selectivity.

As is known, longer self-assembled molecules make the portions having etch selectivity susceptible to etchants. Shorter self-assembled molecules make the portions having etch selectivity etch resistant. Either longer or shorter molecules may be used in different exemplary embodiments. Wet etchants are generally compatible with self-assembled molecules. In this exemplary embodiment, shorter molecules are used to form thin metal lines. Alternatively, longer molecules could be used with a negative image to form trenches.

Figure 7:
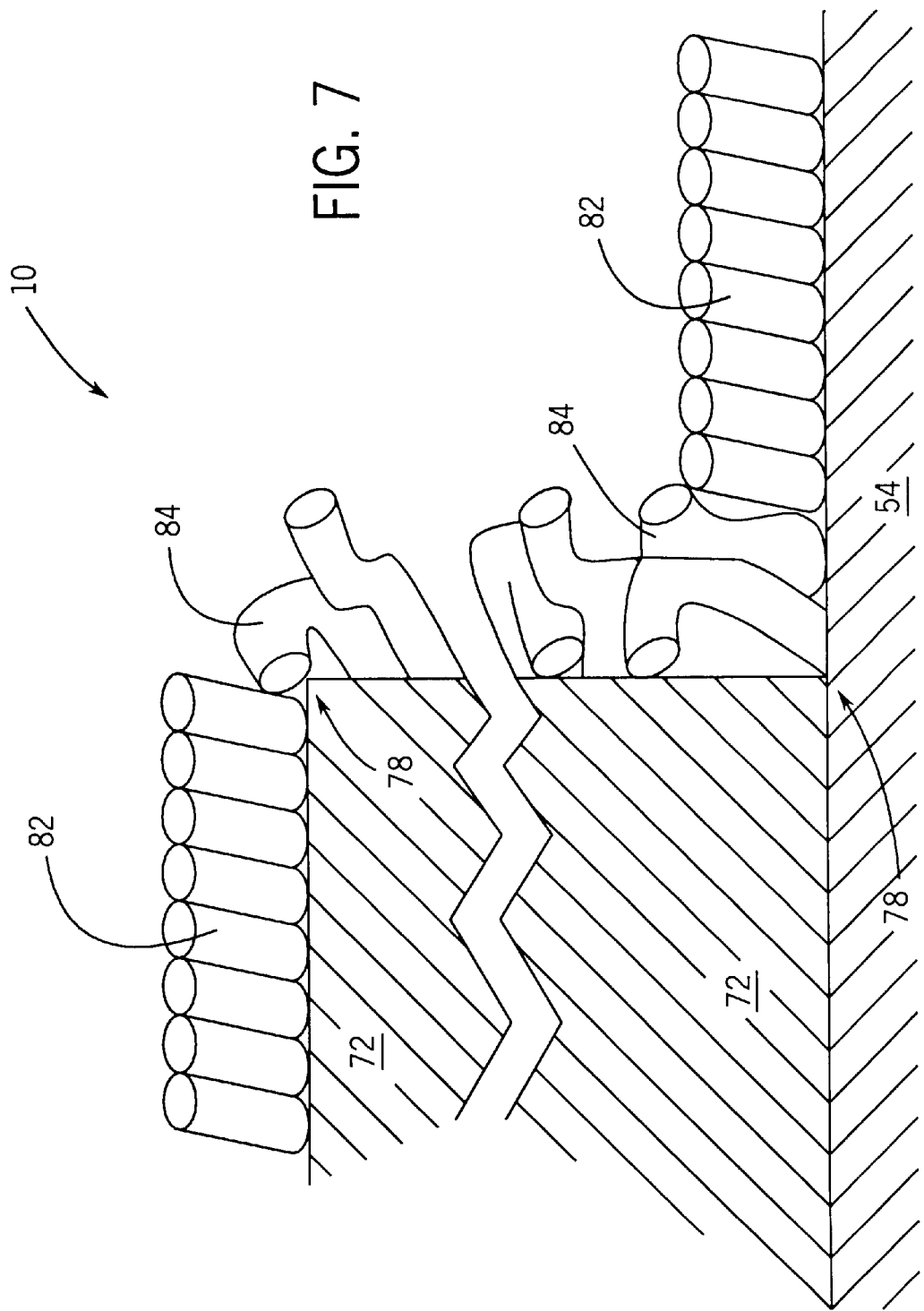
FIG. 7 is a schematic representation of a self-assembled molecular layer on the first portion of FIG. 1, according to an exemplary embodiment.

Referring now to FIG. 7, portions 78, 80 are illustrated after being exposed to thiol. According to one example, a 10 mM solution of $HS(CH_2)_{15}X(X=CH_3 \text{ or } C_2H)$ is provided to features 72 and 74 and layers 54 and 62 for approximately one hour. A plurality of ordered alkanethiolates 82 are formed on layers 54 and 62. At portions 76 and 78, disorder occurs in the SAM, as illustrated by disordered alkanethiolates 84. Thus, by controlling the locations of disorder in alkanethiolates 84 by providing disordered portions 78, 80, or other suitable topography, selectivity to a specific etching process can be obtained.

Referring again to FIG. 6, portions 78, 80 of self-assembled molecular layer having etch selectivity are etched to remove portions 86 and 88 of layers 54 and 62, respectively. Thus, a top surface 90 of layer 54 is exposed and a top surface 92 of layer 62 is exposed. Etching for a further period of time will etch the portions of layers 54 and 62 underneath features 72 and 74, respectively, and further etch features 72 and 74. Thus, the gate length of features 72 and 74 is reduced in a controlled fashion based upon the amount of time that etchant is applied. The etchant may be a wet or dry etchant, or other etchant process. Features 72 and 74 are preferably etched to a width of 20 to 50 nm.

Referring now to FIG. 1, after etching, sidewall spacers, source and drain regions, isolation structures, and other structures necessary for fabricating transistors are provided using conventional techniques.

According to one advantage, the gate mask used in this exemplary embodiment can be less critical, for example, up to 10 or more times less critical, than gate masks used in conventional processes.

Figure 8:
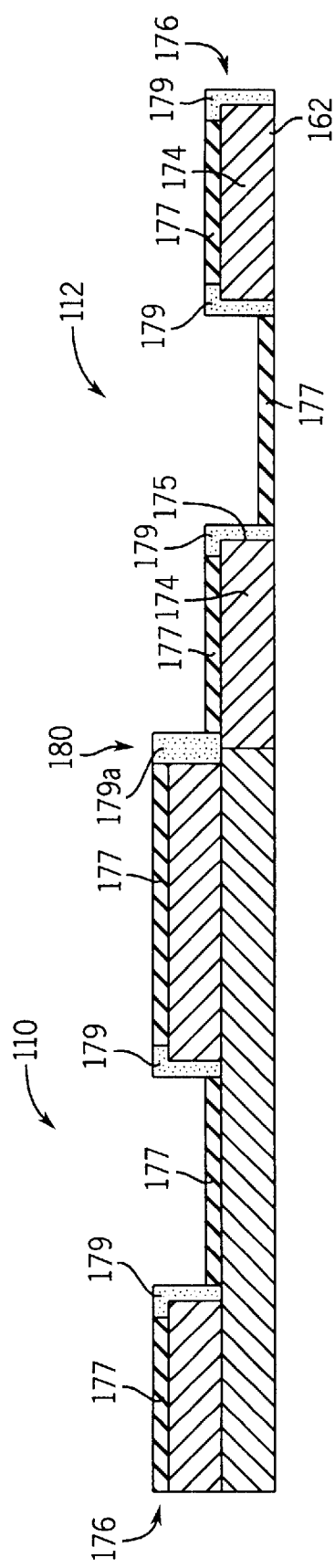
FIG. 8 is a schematic cross-sectional diagram of the first and second portions according to another exemplary embodiment.

Referring now to FIG. 8, another exemplary embodiment will be described. In this embodiment, portions 110 and 112 correspond generally to portions 10 and 12. Portions 110 and 112 are fabricated adjacent to one another in a configuration suitable for fabricating an adjacent pair of transistors for a CMOS device, or at a border between pluralities of N- and P-channel devices.

After the steps illustrated above with reference to FIG. 4, portion 112 is etched to form features 174 and an aperture 175 in second metal layer 162. At portion 110, the following layers would be removed as described hereinabove: photoresist layer 58, portions of metal layer 62 above photoresist layer 58, and photoresist layer 68. A self-assembled molecular layer 176 is then provided having ordered portions 177 and disordered portions 179. Disordered portions 179 occur at areas where the self-assembled molecular layer is provided over a topographical transition region. Layer 176 is then etched selectively at the disordered portions 179 to form gate conductors, as before.

Border 180 includes a disordered portion 179a. After etching, metal beneath disordered portion 179a will remain, forming very fine metal lines. The very fine metal lines will form due to disordered surface of metal step between N- and P-type devices. A non-critical mask and etch process is used to remove unwanted lines because the self-assembled monolayer will create metal lines everywhere that disordered metal is located, while gatelines are usually much shorter and are not continuous. For example, a non-critical mask may be applied over the gate conductors and the very fine metal lines etched.

While the exemplary embodiments illustrated in the FIGS. and described above are presently preferred, it should be understood that these embodiments are offered by way of example only. For example, various self-assembled molecular layers may be used, such as, monolayers or multilayers, Langmuir films, Langmuir-Blodgett films, etc. Further, while the exemplary embodiments are disclosed with respect to dual gate structures, other gate and non-gate structures may be fabricated. For example, long, thin conductive lines may be fabricated, such as, interconnect lines. Accordingly, the present invention is not limited to a particular embodiment, but extends to various modifications that nevertheless fall within the scope of the appended claims.

What is claimed is:

1. A method of forming dual gate structures on first and second portions of a substrate, comprising:
   providing an insulative layer over the substrate;
   providing a first layer of material having a first work function parameter over the first portion of the substrate;
   providing a second layer of material having a second work function parameter different than the first work function parameter over the second portion of the substrate;
   providing a third layer of material over the first and second layers of material;
   providing a self-assembled molecular layer over at least a portion of the third layer of material, wherein the self-assembled molecular layer has regions of etch selectivity; and
   etching the self-assembled molecular layer at the regions of etch selectivity until gate structures are formed over the first and second portions of the substrate.

2. The method of claim 1, wherein the step of providing a first layer of material includes providing the first layer of material over both first and second portions of the substrate and removing the first layer of material from the second portion of the substrate.

3. The method of claim 1, wherein the insulative layer is a gate oxide.

4. The method of claim 1, wherein the first, second, and third layers of material include a gate conductor material.

5. The method of claim 4, wherein the first layer of material is a first gate conductor material and the second and third layers of material are a second gate conductor material, wherein the first gate conductor material is different than the second gate conductor material.

6. The method of claim 1, further comprising doping a gate structure in the first region with an N-type dopant and doping a gate structure in the second region with a P-type dopant.

7. The method of claim 1, wherein the step of patterning further includes:
   providing a photoresist layer over the first portion;
   exposing the photoresist layer to radiation through a mask; and
   developing the photoresist layer to provide features of photoresist over the first layer of material, wherein the third layer of material is provided over the photoresist features.

8. The method of claim 7, wherein the step of patterning further includes:
   providing a second photoresist layer over the second portion;
   exposing the second photoresist layer to radiation through a second mask; and
   developing the photoresist layer to provide second features of photoresist over the second layer of material, wherein the third layer of material is provided over the second photoresist features.

9. The method of claim 1, wherein the step of providing a self-assembled molecular layer includes exposing the third layer of material to a thiol.

10. The method of claim 1, wherein the regions of etch selectivity are disordered regions.

11. The method of claim 1, wherein the step of providing a self-assembled molecular layer includes providing a first portion of the self-assembled molecular layer with molecules having a first length and providing a second portion of the self-assembled molecular layer with molecules having a second length longer than the first length.

12. An integrated circuit having dual gate structures on first and second portions of a semiconductor substrate, the dual gate structures fabricated by the steps of:
   providing an insulative layer over the substrate;
   providing a first layer of gate conductor material having a first work function parameter over the first portion of the substrate;
   providing a second layer of gate conductor material having a second work function parameter different than the first work function parameter over the second portion of the substrate;
   patterning a third layer of gate conductor material over the first and second layers of material, whereby features of the third layer of gate conductor material are provided in both the first and second portions of the substrate;
   providing a self-assembled molecular layer over at least a portion of the features, wherein the self-assembled molecular layer has regions of etch selectivity; and
   etching the self-assembled molecular layer at the regions of etch selectivity until gate structures are formed in the first and second portions of the substrate.

13. The integrated circuit of claim 12, wherein the step of providing a first layer of gate conductor material includes providing the first layer of gate conductor material over both first and second portions of the substrate and removing the first layer of gate conductor material from the second portion of the substrate.

14. The integrated circuit of claim 12, wherein the first gate conductor material is different than the second gate conductor material, wherein the second gate conductor material is the same as the third gate conductor material.

15. The integrated circuit of claim 12, further comprising doping one of the gate structures in the first region with an N-type dopant and doping one of the gate structures in the second region with a P-type dopant.

16. A method of fabricating dual gate structures for N- and P-channel devices on a semiconductor substrate, including:
   doping a first portion of the substrate with a dopant suitable for an N-channel device;
   doping a second portion of the substrate with a dopant suitable for a P-channel device;
   providing a first layer of gate conductor material over the first portion of the substrate;
   providing a second layer of gate conductor material over the second portion of the substrate;
   providing a self-assembled molecular layer over the first and second layers, wherein the self-assembled molecular layer has regions of etch selectivity; and
   etching the self-assembled molecular layer at the regions of etch selectivity until gate structures are formed over the first and second portions of the substrate.

17. The method of claim 16, wherein the regions of etch selectivity are regions of disorder in the self-assembled molecular layer.

18. The method of claim 17, further comprising providing a layer of material over the first and second layers of gate conductor material, wherein the layer of material forms the regions of disorder with respect to the first and second layers of gate conductor material.

19. The method of claim 16, wherein the gate conductor material includes polysilicon.

20. The method of claim 16, further comprising doping a gate structure in the first region with a P-type dopant and doping a gate structure in the second region with an N-type dopant.

* * * * *

UNITED STATES PATENT AND TRADEMARK OFFICE
CERTIFICATE OF CORRECTION

PATENT NO.   : 6,365,466 B1
DATED        : April 2, 2002
INVENTOR(S)  : Zoran Krivokapic It is certified that error appears in the above-identified patent and that said Letters Patent is hereby corrected as shown below:

<u>Column 8,</u>
Lines 13 and 14, delete "region" and insert therefor -- portion --.
Lines 16-17 and 25-26, delete "wherein the step of patterning further includes" and insert therefor -- further comprising --.

<u>Column 9,</u>
Lines 12 and 14, delete "region" and insert therefor -- portion --.

<u>Column 10,</u>
Lines 18 and 19, delete "region" and insert therefor -- portion --.

Signed and Sealed this

Twenty-sixth Day of August, 2003

JAMES E. ROGAN
*Director of the United States Patent and Trademark Office*